(12) United States Patent
Luo

(10) Patent No.: US 6,486,739 B1
(45) Date of Patent: Nov. 26, 2002

(54) AMPLIFIER WITH SELF-BIAS BOOSTING USING AN ENHANCED WILSON CURRENT MIRROR BIASING SCHEME

(75) Inventor: Sifen Luo, Hartsdale, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/008,214

(22) Filed: Nov. 8, 2001

(51) Int. Cl.[7] .................................................. H03F 3/04

(52) U.S. Cl. ........................ 330/288; 330/296; 323/315; 323/316

(58) Field of Search ................................ 330/288, 296; 323/315, 316

(56) References Cited

U.S. PATENT DOCUMENTS 6,194,967 B1 * 2/2001 Johnson et al. ............. 330/288

* cited by examiner

Primary Examiner—Michael B Shingleton
(74) Attorney, Agent, or Firm—Steve R. Biren

(57) ABSTRACT

A power amplifier circuit comprises an amplifying transistor and a dc bias circuit, which comprises an enhanced Wilson current mirror as a self-bias boosting circuit for biasing the amplifying transistor through a bias resistor. The current source and the bias resistor are configured to make the charging rate faster than the discharging rate. Furthermore, the current source of the enhanced Wilson current mirror dictates the quiescent current of the amplifying transistor. Preferably, the quiescent current may be set as in direct proportion to the current source by scaling the emitter area ratios between transistor pairs.

20 Claims, 1 Drawing Sheet

AMPLIFIER WITH SELF-BIAS BOOSTING USING AN ENHANCED WILSON CURRENT MIRROR BIASING SCHEME

FIELD OF THE INVENTION

This invention relates to transistor amplifier circuits, and more particularly, to a power amplifier circuit having a self-bias boosting circuit for achieving higher output power and linearity as input power increases.

BACKGROUND OF THE INVENTION

A linear RF power amplifier is commonly biased in class AB operation so as to achieve higher power-added efficiency. Such an amplifier is commonly used in the output stage of high-frequency power amplifiers. However, in a conventionally biased class AB amplifier, the average bias supply current increases as RF input power increases. This increased average current results in an increased voltage drop in the resistive part of the bias circuit. This in turn reduces the average voltage drop across the forward-biased PN junction of the power amplifying transistor, pushing the amplifier into class B and even class C operations. Therefore, the output power will be saturated as the input power further increases.

To overcome this problem, a boosting circuitry is usually used to increase the bias of the power transistor, such as a bias boosting circuitry, a self-bias boost scheme or an adjustable self-bias boost scheme.

In addition to the boosting of the voltage drop across the base-emitter junction of the amplifying transistor, linearity shall also be considered for the power amplifier. Linearity and power-added efficiency are two contradictory requirements in a power amplifier. A tradeoff between the linearity and power-added efficiency is needed for given specifications for the power amplifier. It is usually done by achieving the highest power-added efficiency for a given linearity requirement. This requires a good control of the quiescent current of the power amplifier. To do so, an impedance-controllable biasing scheme is suggested to be used to provide independent control of quiescent current of the power amplifier. Therefore, it could achieve high power-added efficiency while maintaining its linearity by properly controlling the quiescent current. However, such a scheme is not simple and compact enough.

Therefore, the object of the present invention is to provide a power amplifier circuit with a novel biasing scheme which is simple but capable of providing both self-bias boosting capacity and good controlling of quiescent current of the power transistor.

SUMMARY OF THE INVENTION

To achieve the above object, the power amplifier circuit of the present invention comprises an amplifying transistor and a dc bias circuit comprising a novel self-bias boosting circuit. The self-bias boosting circuit comprises a charging circuit for charging the amplifying transistor at a charging rate and a discharging circuit for discharging the amplifying transistor at a discharging rate. The self-bias boosting circuit is configured such that the charging rate is faster than the discharging rate, thus the voltage drop across the PN junction of the amplifying transistor is boosted as the input power increases.

In particular, the self-bias boosting circuit is an enhanced Wilson current mirror with a current source and an output terminal coupled to a control terminal of the amplifying transistor, preferably through a bias resistor. The current source and the bias resistor are controllable to make the charging rate faster than the discharging rate. Furthermore, the current source of the enhanced Wilson current mirror dictates the quiescent current of the amplifying transistor. Preferably, the quiescent current may be set as in direct proportion to the current source by scaling the emitter area ratios between transistor pairs.

BRIEF DESCRIPTION OF THE DRAWING

The above and other features and advantages of the present invention will be clearer from the detailed description of the preferred embodiment with reference to the accompanying drawing.

DETAILED DESCRIPTION OF THE INVENTION

Figure 1:
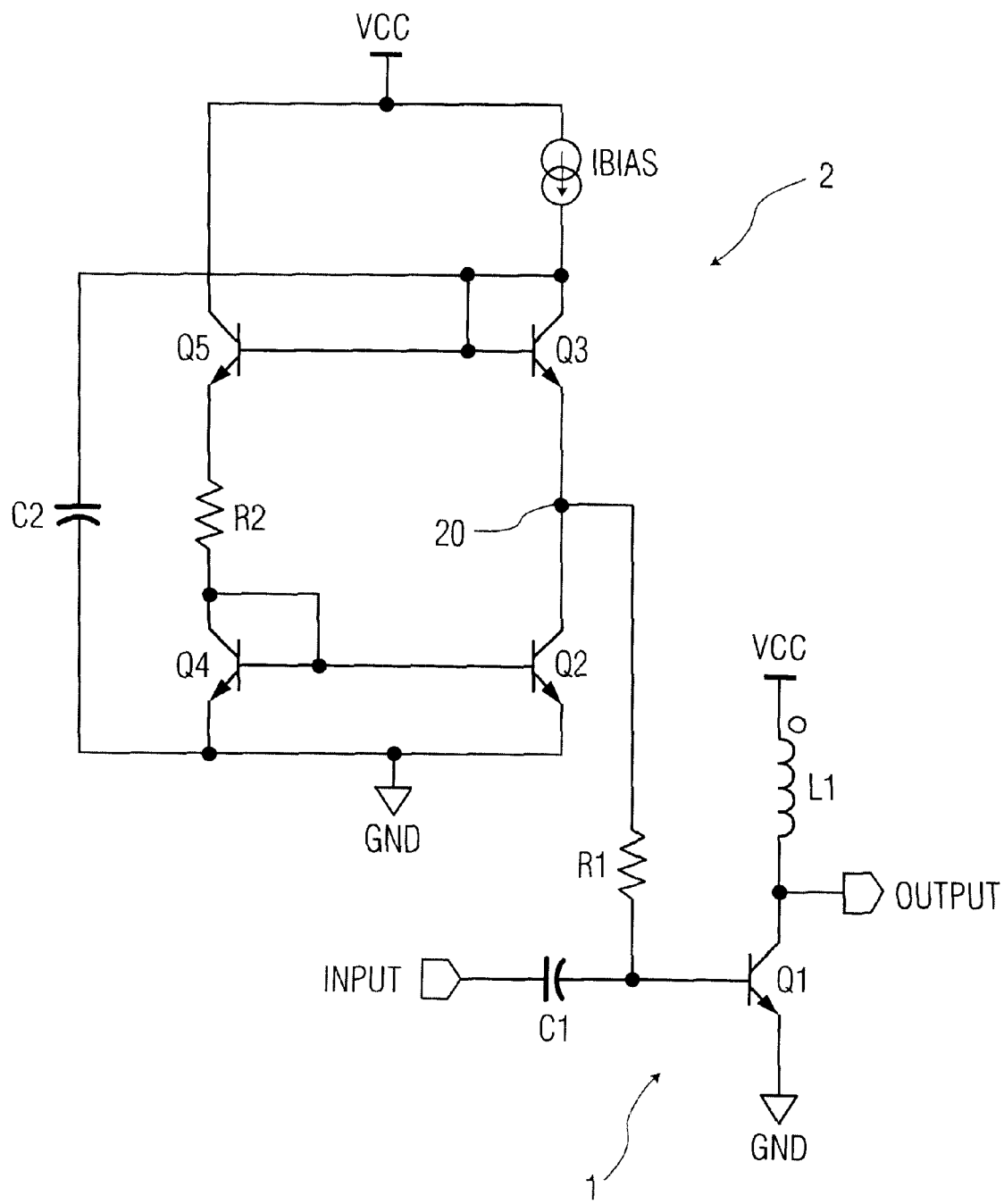
FIG. 1 is a simplified schematic diagram of a preferred embodiment of the power amplifier circuit in accordance with the present invention.

Reference is made to FIG. 1, which shows a preferred embodiment of the power amplifier circuit of the present invention. The inventive power amplifier circuit generally comprises an amplifying transistor Q1 and a dc bias circuit. In particular, the dc bias circuit comprises an enhanced Wilson current mirror 2, which acts as a self-bias boosting circuit for the amplifying transistor Q1 through a bias resistor 3, as will be explained below.

In this preferred embodiment, the amplifying transistor 1 is a common-emitter transistor, in which the emitter is coupled to the ground as a common terminal. The collector node of transistor Q1 is the output node that is connected to a supply voltage Vcc through an external pull-up inductor L1. A RF input power is applied to the base of the transistor Q1 through an AC coupling capacitor C1 that can be part of matching to a drive stage.

The enhanced Wilson current mirror 2 comprises a first pair of mirror transistors Q3 and Q5 and a second pair of mirror transistors Q2 and Q4. The emitter node of Q3 is coupled to the collector node of Q2 directly, while the emitter node of Q5 is coupled to the collector node of Q4 through a resistor R2. The emitter nodes of the second pair of transistors Q2 and Q4 are coupled to the ground, and a bypass capacitor C2 is connected between the base of Q3 and the ground.

A current source Ibias is provided to the collector node of Q3, and the output terminal 20 is coupled to the emitter of Q3 and the collector of Q2. The output from the output terminal 20 biases the base node of the amplifying transistor Q1 through the bias resistor R1.

As shown in the figure, Q3 charges Q1 through the resistor R1 at a charging rate, while Q2 discharges Q1 through the resistor R1 at a discharging rate. Ibias and R1 control the charging and discharging rates when transistor sizes are chosen. When the bias resistor R1 is fixed, the current source Ibias is selected such that the charging rate is faster than the discharging rate. Thus, the average voltage across the forward-biased PN junction of Q1 increases as the RF input power increases, and the self-bias boosting capacity is achieved. By properly controlling current source Ibias, the charging and discharging rates can provide desirable bias boosting for achieving optimized output power, gain, power-added efficiency when R1 is fixed, as well as the linearity which will be explained below.

As in an enhanced Wilson current mirror, it is appreciated that the current source Ibias in the bias circuit controls the drive current. Furthermore, the current source Ibias also controls the quiescent current of the amplifying transistor Q1. This is explained as follows.

Let's assume that all transistors in the circuits are identical and perfectly matched. Kirchoff's Law dictates the following equation for DC voltages:

$$Vbe(Q1)+V(R1)+Vbe(Q3)=Vbe(Q2)+V(R2)+Vbe(Q5)$$

As Vbe(Q3) is approximately equal to Vbe(Q2), Vbe(Q1) is therefore approximately equal to Vbe(Q5) when V(R1) is set equal to V(R2) by properly choosing the resistance values for resistors R1 and R2. Therefore the current source Ibias dictates the quiescent current in amplifying transistor Q1 as well as the drive current in Q2 and Q3.

Preferably, the quiescent current in Q1 may be configured to be directly proportional to the value of current source Ibias by properly scaling the emitter areas ratios between the transistor pairs. For example, the ratio of Q1 to Q5 is set as 64 to 1, while the ratios of Q2 to Q4 and Q3 to Q5 are set as 8 to 1. Thus, the quiescent current of amplifying transistor Q1 is in good control by the current source Ibias.

While the invention has been described in details with reference to the preferred embodiment, it shall be appreciated that various changes and modifications are possible to those skilled in the art without departing the gist of the invention. For example, the resistor R2 can be replaced by two resistors in the bases of Q2 and Q4 if necessary. The transistors are not limited to the bipolar junction type (BJTs) as exemplified in the preferred embodiment. They may be field-effect transistors (FETs) or both. Thus, the scope of the invention is intent to be solely defined in the accompanying claims.

What is claimed is:

1. A power amplifier circuit, comprising an amplifying transistor and a dc bias circuit, wherein said dc bias circuit comprises a self-bias boosting circuit including an enhanced Wilson current mirror circuit, a portion of which charges said amplifier circuit, and a portion of which discharges said amplifier circuit, said charging and discharging rates being different.

2. The power amplifier circuit of claim 1 wherein said enhanced Wilson current mirror has a current source and an output terminal that is coupled to a control terminal of said amplifying transistor.

3. The power amplifier circuit of claim 2 wherein said enhanced Wilson current mirror comprises a first pair of mirror transistors including a first and a second transistors, and a second pair of mirror transistors including a third and a fourth transistors, with said current source coupled to a collector of said first transistor.

4. The power amplifier circuit of claim 3 wherein an emitter of said first transistor is coupled to a collector of said third transistor directly, and an emitter of said second transistor is coupled to a collector of said fourth transistor through a resistor.

5. The power amplifier circuit of claim 4 wherein said output terminal is coupled to said emitter of said first transistor and said collector of said third transistor.

6. The power amplifier circuit of claim 5 wherein a bias resistor is coupled between said output terminal and said control terminal of said amplifying transistor such that said amplifying transistor is charged by said first transistor through said bias resistor at a charging rate, and is discharged by said third transistor through said bias resistor at a discharging rate.

7. The power amplifier circuit of claim 6 wherein said bias resistor and said current source are configured such that said charging rate is faster than said discharging rate.

8. The power amplifier circuit of claim 7 wherein said bias resistor is fixed.

9. The power amplifier circuit of claim 8 wherein emitter area ratios between said first pair of transistors, between said second pair of transistors and between said amplifying transistor and said second transistor are scaled such that a quiescent current in said amplifying transistor is directly proportional to said current source of said enhanced Wilson current mirror.

10. The power amplifier circuit of claim 1 wherein said amplifying transistor is a common-emitter transistor, and said control terminal is a base node of said amplifying transistor.

11. The power amplifier circuit of claim 9, wherein it is a Class AB amplifier circuit.

12. A power amplifier circuit for amplifying an input power, said amplifier comprising an amplifying transistor and a dc bias circuit, wherein said dc bias circuit comprises a self-bias boosting circuit capable of charging and discharging said amplifying transistor with a charging rate faster than a discharging rate whereby an average voltage between a control terminal and a common terminal of said amplifying transistor increases as said input power increases.

13. The power amplifier circuit of claim 12 wherein said amplifier circuit has a conduction angle greater than 180°.

14. The power amplifier of claim 12 wherein said self-bias boosting circuit comprises an enhanced Wilson current mirror having a current source and an output terminal, said output terminal being coupled to a control terminal of said amplifying transistor.

15. The power amplifier of claim 14 wherein a bias resistor is coupled between said control terminal of said amplifying transistor and said output terminal of said enhanced Wilson current mirror.

16. The power amplifier of claim 15 wherein said bias resistor is fixed, and said current source of said enhanced Wilson current mirror is controlled such that said charging rate is faster than said discharging rate.

17. The power amplifier of claim 16 wherein both said bias resistor and said current source of said enhanced Wilson current mirror are configured such that said charging rate is faster than said discharging rate.

18. The power amplifier of claim 17 wherein said amplifying transistor is a common-emitter transistor, and said control terminal is a base node of said amplifying transistor.

19. A power amplifier circuit for amplifying an input signal, said amplifier comprising an amplifying transistor and a dc bias circuit including a self-bias boosting circuit, wherein said self-bias boosting circuit comprises a charging circuit for charging said amplifying transistor at a charging rate and a discharging circuit for discharging said amplifying transistor at a discharging rate, wherein said self-bias boosting circuit is configured such that said charging rate is faster than said discharging rate.

20. The power amplifier circuit of claim 19 wherein said amplifying transistor is a FET transistor.

* * * * *